US009589941B1

(12) United States Patent
Chen et al.

(10) Patent No.: US 9,589,941 B1
(45) Date of Patent: Mar. 7, 2017

(54) MULTI-CHIP PACKAGE SYSTEM AND METHODS OF FORMING THE SAME

(71) Applicant: Taiwan Semiconductor Manufacturing Company, Ltd., Hsin-Chu (TW)

(72) Inventors: Chih-Hua Chen, Zhubei (TW);
 Yu-Feng Chen, Hsin-Chu (TW);
 Hao-Yi Tsai, Hsin-Chu (TW);
 Chung-Shi Liu, Hsin-Chu (TW);
 Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/996,715

(22) Filed: Jan. 15, 2016

(51) Int. Cl.
 *H01L 23/00* (2006.01)
 *H01L 25/10* (2006.01)
 *H01L 25/00* (2006.01)
 *H01L 23/58* (2006.01)
 *H01L 25/065* (2006.01)

(52) U.S. Cl.
 CPC ............ *H01L 25/105* (2013.01); *H01L 23/58* (2013.01); *H01L 25/0657* (2013.01); *H01L 25/50* (2013.01); *H01L 2224/16145* (2013.01); *H01L 2224/32145* (2013.01); *H01L 2225/1041* (2013.01); *H01L 2225/1058* (2013.01); *H01L 2225/1088* (2013.01)

(58) Field of Classification Search
 CPC ....... H01L 2224/32145; H01L 25/0657; H01L 2224/16145
 See application file for complete search history.

(56) References Cited

U.S. PATENT DOCUMENTS

| | | | |
|---|---|---|---|
| 6,150,724 A * | 11/2000 | Wenzel | ............... H01L 25/0657 257/724 |
| 7,564,115 B2 | 7/2009 | Chen et al. | |
| 7,633,165 B2 | 12/2009 | Hsu et al. | |
| 7,825,024 B2 | 11/2010 | Lin et al. | |
| 7,973,413 B2 | 7/2011 | Kuo et al. | |
| 8,105,875 B1 | 1/2012 | Hu et al. | |
| 8,158,456 B2 | 4/2012 | Chen et al. | |
| 8,183,578 B2 | 5/2012 | Wang | |
| 8,183,579 B2 | 5/2012 | Wang | |
| 8,227,902 B2 | 7/2012 | Kuo | |
| 8,278,152 B2 | 10/2012 | Liu et al. | |
| 8,426,961 B2 | 4/2013 | Shih et al. | |
| 8,669,174 B2 | 3/2014 | Wu et al. | |

(Continued)

*Primary Examiner* — Ngan Ngo

(74) *Attorney, Agent, or Firm* — Slater Matsil, LLP

(57) ABSTRACT

In an embodiment, a semiconductor structure includes a multi-chip package system (MCPS). The MCPS includes one or more dies, a molding compound extending along sidewalls of the one or more dies, and a redistribution layer (RDL) over the one or more dies and the molding compound. The semiconductor structure also includes at least one sensor coupled to the RDL, with the RDL interposed between the at least one sensor and the one or more dies. The semiconductor structure further includes a substrate having conductive features on a first side of the substrate. The conductive features are coupled to the RDL. The substrate has a cavity extending from the first side of the substrate to a second side of the substrate opposite the first side, and the at least one sensor is disposed in the cavity.

20 Claims, 9 Drawing Sheets

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |
| 2004/0173913 A1* | 9/2004 | Ohta ................. G01P 1/023 257/777 |
| 2004/0221451 A1* | 11/2004 | Chia ............. H01L 21/6835 29/854 |
| 2005/0012195 A1* | 1/2005 | Go ................. H01L 23/3128 257/686 |
| 2005/0046003 A1* | 3/2005 | Tsai ............. H01L 23/49575 257/686 |
| 2006/0016973 A1* | 1/2006 | Yang ............. H01L 31/0203 250/239 |
| 2012/0013007 A1* | 1/2012 | Hwang ............. H01L 24/32 257/738 |
| 2013/0001797 A1* | 1/2013 | Choi ............... H01L 25/105 257/774 |
| 2014/0001645 A1 | 1/2014 | Lin et al. |
| 2014/0225258 A1 | 8/2014 | Chiu et al. |
| 2014/0252572 A1 | 9/2014 | Hou et al. |
| 2014/0291842 A1* | 10/2014 | Ang ............. H01L 23/49811 257/738 |
| 2015/0123290 A1* | 5/2015 | Kim ............... H01L 25/105 257/777 |
| 2016/0064358 A1* | 3/2016 | Usami ........... H01L 25/0657 257/737 |
| 2016/0276308 A1* | 9/2016 | Min ............... H01L 25/0652 |

\* cited by examiner

MULTI-CHIP PACKAGE SYSTEM AND METHODS OF FORMING THE SAME

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

Multi-chip package (MCP) technology is a new packaging technology spurred by the continued demands of electronics industry for miniaturization and decreased weight. To meet these demands, MCPs were introduced which include a plurality of semiconductor chips in a single package. Various three-dimensional MCPs have been developed, and in particular, new technology has been introduced for chip level integration rather than package level integration. The MCP technology has the advantages of a simple manufacturing process and design flexibility. As technology continues to evolve, new improvements and applications of MCP technology are being developed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
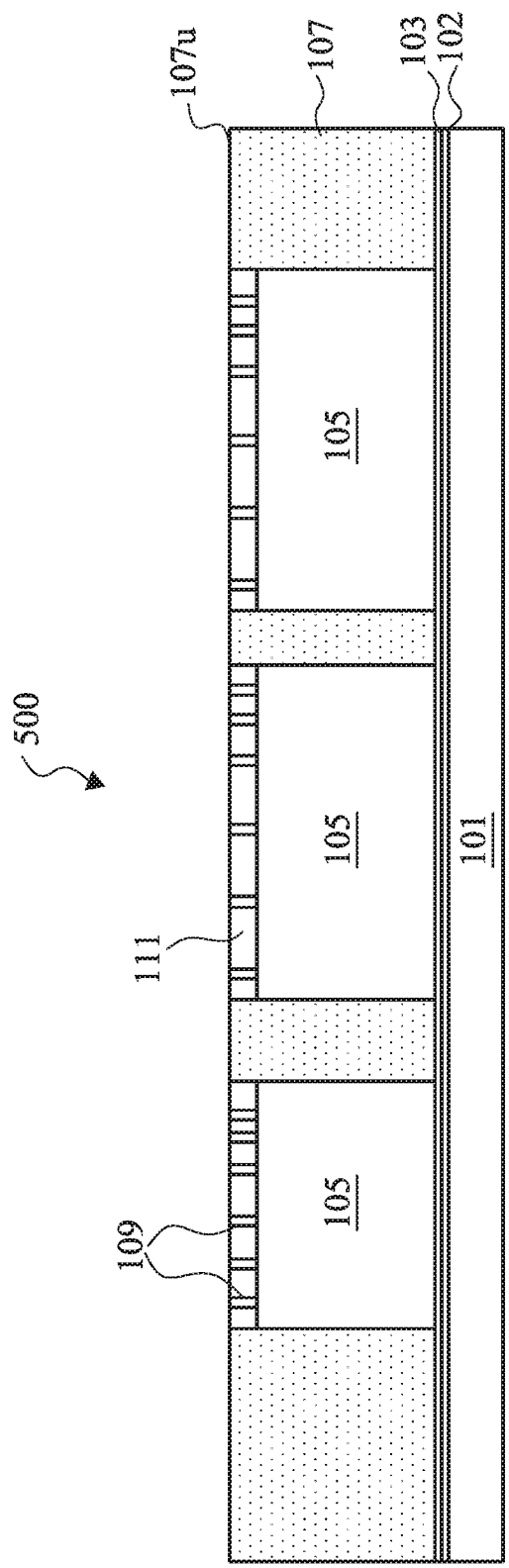
FIGS. 1-6 illustrate cross-sectional views of a semiconductor structure at various stages of a fabrication process, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are described with respect to a particular context, namely, methods and structures for a system with an MCP package. Various embodiments include forming an MCP package by integrating multiple semiconductor dies together and forming a redistribution layer (RDL) over the semiconductor dies. In various embodiments, sensors are coupled to the RDL via under-bump-metallurgy (UBM) structures, or UBMs, formed over the RDL, and a substrate with a cavity is attached to the MCP package, with the sensors disposed in the cavity.

FIGS. 1-6 illustrate cross-sectional views of a semiconductor structure 500 at different stages of a fabrication process, in accordance with some embodiments.

Referring first to FIG. 1, a plurality of semiconductor dies 105 or semiconductor chips 105 are attached to a carrier 101. The plurality of semiconductor dies 105 may be of same or similar types (e.g., performing same or similar functions). Alternatively, the semiconductor dies 105 may be of different types. For example, one semiconductor die 105 might be a memory chip, another semiconductor die 105 might be a logic chip, while another semiconductor die 105 might be a digital signal processor (DSP). Although FIG. 1 illustrates three semiconductor dies 105, more or less than three semiconductor dies may be used in a MCP package, and the semiconductor dies 105 may be of any suitable types of semiconductor dies. Carrier 101 comprises glass, silicon, bulk material such as bulk silicon, polymer, polymer composite, metal foil, ceramic, glass, glass epoxy, beryllium oxide, tape, or other suitable material for structural support, in accordance with some embodiments. In the example of FIG. 1, the semiconductor dies 105 are attached to carrier 101 by a film 103, such as a die attaching film (DAF). Film 103 may therefore be referred to as DAF 103 in the description hereafter, with the understanding that other types of film may also be used for attaching dies 105 to carrier 101. An adhesive layer 102 may be deposited or laminated over carrier 101. In some embodiments, carrier 101 is made of glass, adhesive layer 102 is photosensitive and is easily detached from carrier 101 by shining ultra-violet (UV) light on carrier 101 in a subsequent carrier de-bonding process. For example, the adhesive layer may be a light-to-heat-conversion (LTHC) coating made by 3M Company of St. Paul, Minn. Alternatively, adhesive layer 102 may comprise other material such as glue.

Referring to FIG. 1, semiconductor dies 105 are attached to carrier 101 with the sides having conductive features 109 (e.g., vias 109 or bumps 109) facing away from carrier 101, in some embodiments. Conductive features 109 provide electrical connection to the internal circuits of semiconductor dies 105, in accordance with some embodiments. Conductive features 109 may be embedded in an insulating layer 111. Insulating layer 111 comprises polyimide (PI), polybenzoxazole (PBO), or the like, in some embodiments. Insulating layer 111 may function as a stress relief coating and/or a protection layer, and may protect dies 105 in subsequent processing (e.g., a grinding process) discussed hereinafter.

Still referring to FIG. 1, a molding compound 107 is formed over the semiconductor dies 105 and carrier 101. Molding compound 107 may comprise epoxy resin, a molding underfill, and the like, and may be formed by compressive molding, transfer molding, liquid encapsulent molding, or any other suitable method. After molding compound 107 is formed, a planarization process, such as a chemical mechanical planarization (CMP) process, or a grinding process may be performed to remove excess molding compound 107 over dies 105 and to produce a planar upper surface 107u for molding compound 107. The planarization process may stop when top surfaces of conductive features 109 are exposed, so that the upper surface 107u of molding compound 107 is coplanar with upper surfaces of the semiconductor dies 105.

Figure 2:
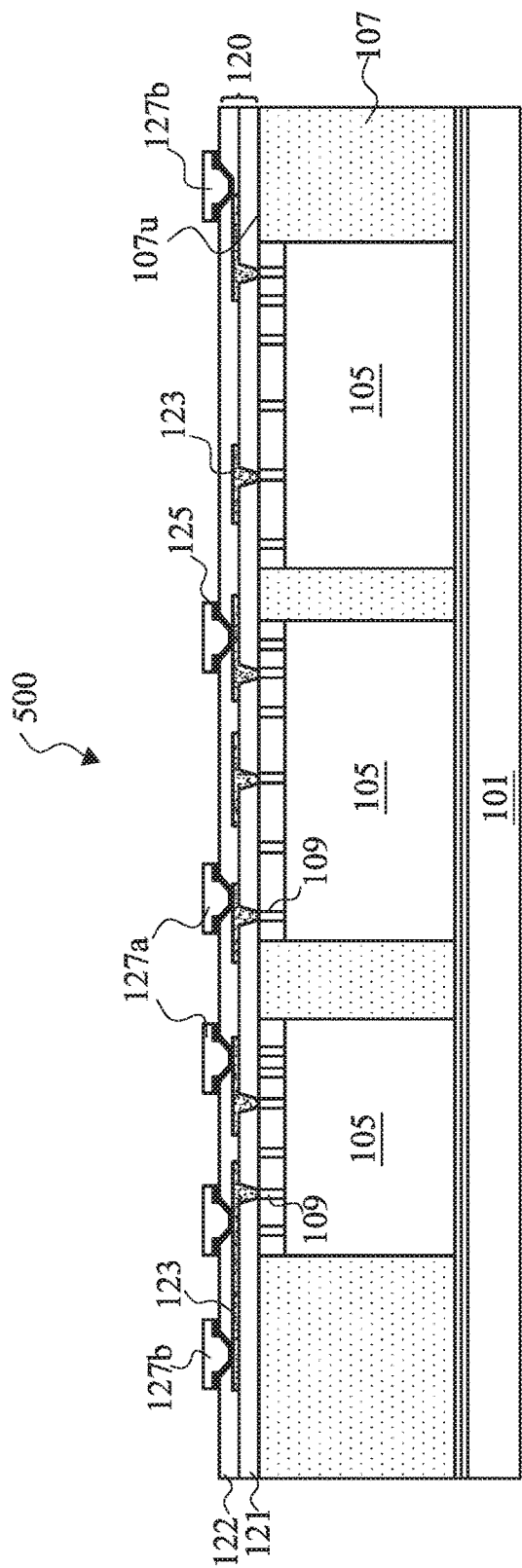

Next, as illustrated in FIG. 2, redistribution layers (RDLs) 120 is formed over semiconductor dies 105 and the upper surface 107u of molding compound 107. The RDLs 120 include one or more conductive layers (e.g., conductive lines and/or vias) formed in one or more insulating layers, which conductive layers are electrically coupled to semiconductor dies 105 and reroute electrical signals to provide access for connection with other electrical components, in some embodiments. For example, the RDLs 120 may extend laterally beyond external perimeters of semiconductor dies 150 to provide fan-out interconnect structures. The RDLs 120 may be collectively referred to as a redistribution layer (RDL) or a redistribution structure hereafter. As described in greater detail below, the RDLs 120 comprise one or more insulating layers (e.g., insulating layers 121 and 122) and one or more conductive features (e.g., conductive feature 123) disposed within the one or more insulating layers. The first insulating layer 121 may comprise photo-patternable insulating materials such as polyimide, benzocyclobutene (BCB), polybenzoxazole (PBO), the like, or a combination thereof, in some embodiments. In other embodiments, the first insulating layer 121 may comprise non-photo-patternable insulating materials such as silicon nitride, silicon carbide, silicon oxide, silicon oxynitride, low-k dielectrics such as carbon doped oxides, extremely low-k dielectrics such as porous carbon doped silicon dioxide, the like, or a combination thereof. The first insulating layer 121 may be deposited by CVD, PVD, ALD, a spin-on-dielectric process, the like, or a combination thereof.

Referring further to FIG. 2, openings (not shown) are formed in the first insulating layer 121 to expose the conductive vias or bumps 109 using, e.g., a photolithography technique, in some embodiments. Conductive patterns 123 are formed over the first insulating layer 121 and in the openings. In some embodiments, the conductive patterns 123 contact the conductive vias/bumps 109. The conductive patterns 123 may comprise various lines/traces (running "horizontally" across a top surface of the first insulating layer 121) and/or vias (extending "vertically" into the openings in the first insulating layer 121, and contacting the underlying conductive vias/bumps 109). As illustrated in FIG. 2, the conductive patterns 123 extend beyond boundaries of semiconductor dies 105 to provide fan-out interconnect structures. In some embodiments, the conductive patterns 123 are formed by depositing a seed layer (not shown) over the first insulating layer 121 and in the openings. The seed layer may comprise copper, titanium, nickel, gold, manganese, the like, or a combination thereof, and may be formed by ALD, sputtering, PVD process, the like, or a combination thereof. Subsequently, a photoresist material (not shown) is deposited over the seed layer and patterned to define the desired pattern for the conductive patterns 123. A conductive material, such as copper, tungsten, aluminum, silver, gold, the like, or a combination thereof, and is formed on the seed layer by an electro-chemical plating process, an electroless plating process, ALD, PVD, the like, or a combination thereof. The photoresist material is removed using appropriate photoresist removal process, such as ashing followed by a wet clean process. Exposed portions of the seed layer over the first insulating layer 121 are removed using, for example, a wet or dry etch.

Referring further to FIG. 2, the second insulating layer 122 is formed over the first insulating layer 121 and the conductive patterns 123, which completes formation of the RDLs 120. In the illustrated embodiment, the second insulating layer 122 is similar to the first insulating layer 121, may be formed using similar methods and the description is not repeated herein. The formation methods for insulating layers 121 and the conductive patterns 123 described above may be repeated to form additional insulating layers and conductive patterns. As shown in FIG. 2, the RDLs 120 comprise two insulating layers (such as the first insulating layer 121 and the second insulating layer 122) and one conductive patterns (such as the conductive patterns 123) interposed between the insulating layers. One skilled in the art will recognize that the number of insulating layers and the number of conductive patterns are provided for illustrative purpose only and are not limiting the scope of the present disclosure. In other embodiments, the RDLs 120 may comprise other numbers of insulating layers and conductive patterns depending on design requirements for the semiconductor structure 500.

Referring further to FIG. 2, UBMs 127 (e.g., 127a and 127b) are formed over and electrically coupled to RDLs 120. In accordance with some embodiments of the present disclosure, each of UBMs 127 includes a barrier layer 125 and a metal layer over the barrier layer. In some embodiments, openings (not shown) are formed in the top insulating layer of RDLs 120 (e.g., the second insulating layer 122 of FIG. 2) to expose conductive patterns of RDLs 120 (e.g., conductive patterns 123 of FIG. 2) using photolithography technique. Subsequently, barrier layers 125 are formed over the top insulating layer, which barrier layers extend into the openings and contact the top conductive patterns. The barrier layers may be a titanium layer, a titanium nitride layer, a tantalum layer, a tantalum nitride layer, or a layer formed of a titanium alloy or a tantalum alloy, and may be formed by ALD, sputtering, PVD, the like, or a combination thereof.

Metal such as copper, aluminum, tungsten, silver, gold, or the like is formed over barrier layers 125 by, e.g., electrochemical plating process, an electroless plating process, ALD, PVD or other suitable method to complete UBMs 127 (e.g., 127a and 127b), as illustrated in FIG. 2. UBMs 127 may or may not be connected to semiconductor dies 105. As illustrated in FIG. 2, some UBMs (e.g., UBMs 127a) are formed within the boundaries of semiconductor dies 105, while other UBMs (e.g., UBMs 127b) are formed outside boundaries of semiconductor dies 105.

Figure 3:
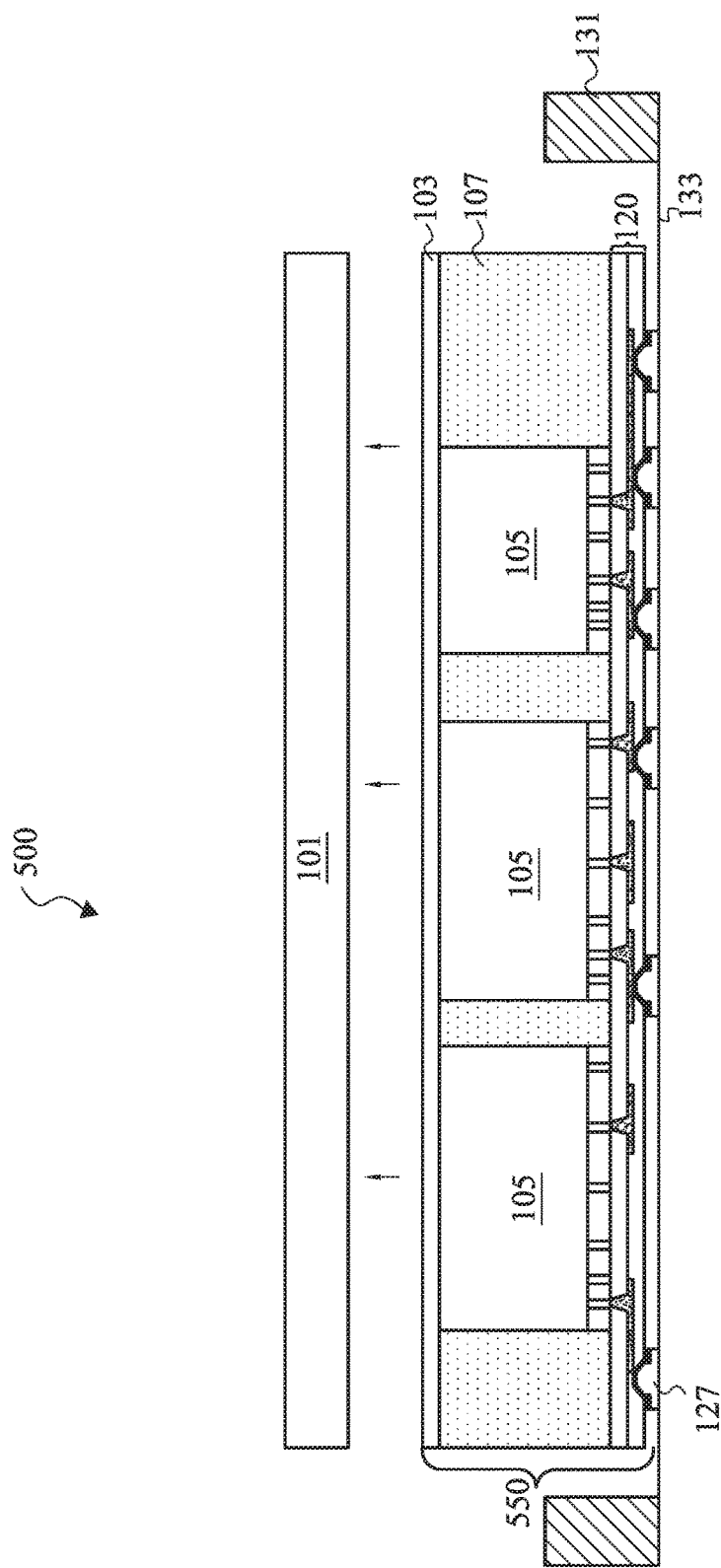

Next, as illustrated in FIG. 3, the side of semiconductor structure 500 having UBMs 127 is attached to a film 133 supported by a frame 131. Subsequently, carrier 101 is removed by a de-bonding process, in some embodiments. In embodiments in which the adhesive layer 102 is a LTHC coating, carrier 101 may be de-bonded by shining a light source, e.g., an ultra-violet (UV) light, through carrier 101. In other embodiments, carrier 101 may be de-bonded by mechanical peel-off, CMP, mechanical grinding, chemical wet etching, or wet stripping, as examples. After the de-bonding process, DAF 103 is removed by a DAF cleaning process (not shown in FIG. 3), in some embodiments. In other embodiments, DAF 103 remains on the semiconductor structure 500, and no DAF cleaning process is performed. The semiconductor structure 500 shown in FIG. 3 after the de-bonding process (excluding frame 131 and film 133) may be referred to as a multi-chip package (MCP) system 550 or a MCPS 550 (see label in FIG. 3) hereafter. MCPS 550 may or may not include the DAF 103, which is peeled off in a subsequent processing step.

Figure 4:
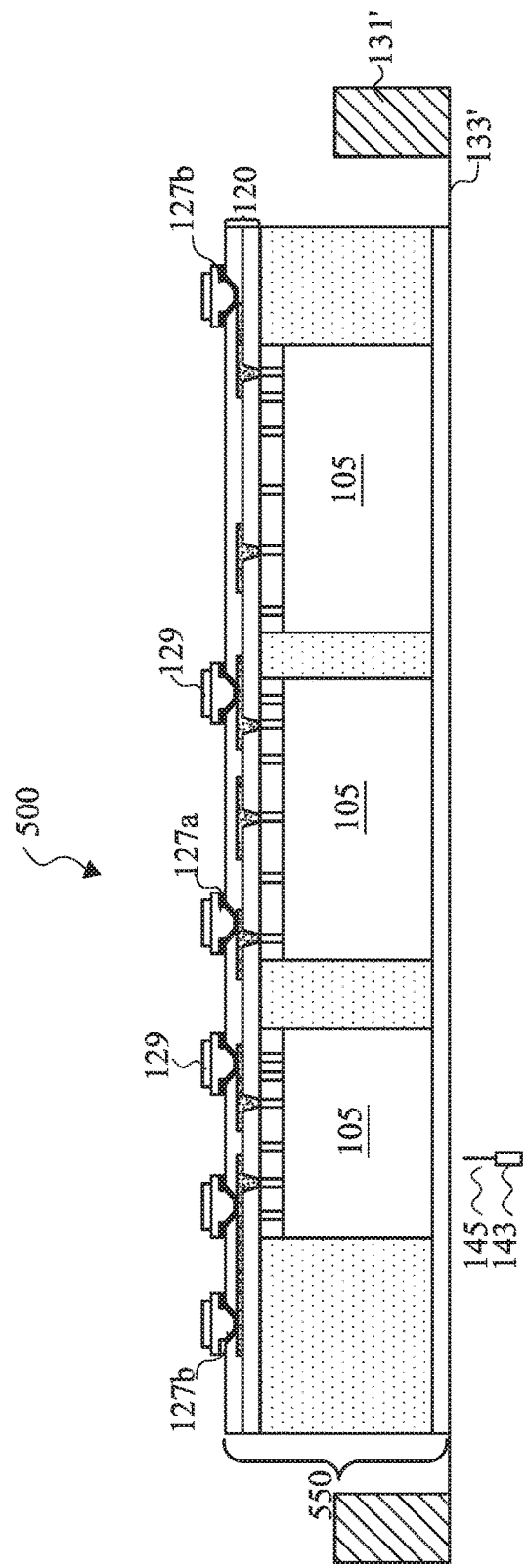

Referring to FIG. 4, the semiconductor structure 500 formed in FIG. 3 is detached from film 133 and attached to a film 133' supported by a frame 131', with RDLs 120 extending away from film 133'. Frame 131' and film 133' may, or may not, be the same as frame 131 and film 133 shown in FIG. 3. A laser marking process is performed to form laser marks (not shown) on a first side of semiconductor structure 500 opposite to a second side having RDLs 120, in some embodiments. The laser marking process may be performed using a laser beam 145 from a laser device 143, which laser beam burns and/or removes parts of tape 133' and the top dielectric layer(s) on the first side of the semiconductor structure 500. Laser marks may include letters, digits, figures, or any other symbols that can be used for identification purpose. For example, laser marks may be used to identify the product, the manufacturing sequence, the lot number of the respective package, or any other information that is used to track the respective package. The laser marking process may alternatively be performed after the carrier de-bonding process shown in FIG. 3. Therefore, MCPS 550 may also include the laser marks. Next, solder paste 129 are formed on UBMs 127 using, e.g., a solder printing machine or a screen printing process, in some embodiments.

Figure 5:
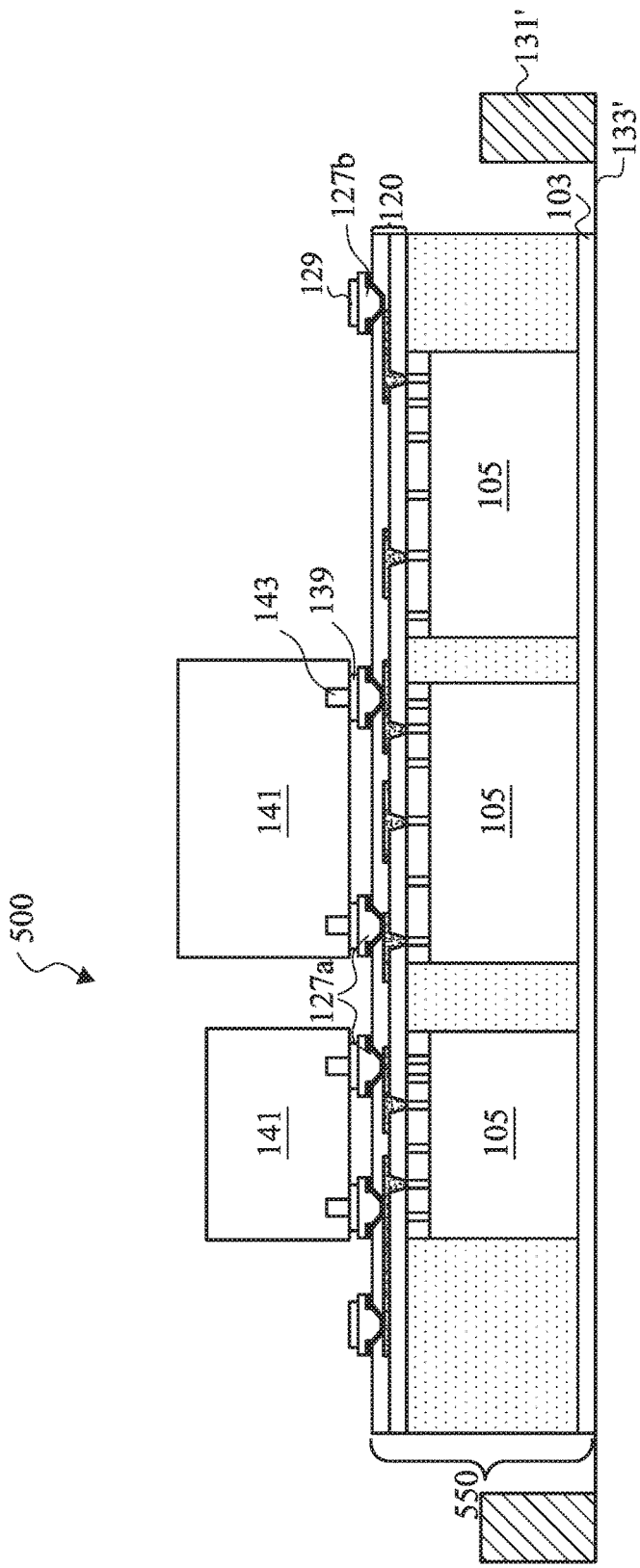

Next, as illustrated in FIG. 5, electrical components 141 are attached to UBMs 127a of the semiconductor structure 500. Electrical components 141 may be, e.g., sensors or semiconductor dies. A first electrical component 141 may be of a different type from a second electrical component 141, although the first electrical component 141 could also be of the same type as the second electrical component 141. In an exemplary embodiment, electrical components 141 are sensors. Each of the sensors 141 may be, e.g., a temperature sensor, a humidity sensor, a heart rate sensor, a light-emitting-diode (LED) sensor, or an environment sensor. An LED sensor may be used for, e.g., measuring blood oxygen levels in applications such as pulse oximeter or smart watch, as examples. The temperature sensor and the humidity sensor may be used for measuring a user's (e.g., a human user) body temperature and skin humidity. The environment sensor may be used to measure ambient environment, such as air pressure, temperature, humidity, UV light, toxic gas concentration, and/or other parameters. Electrical components 141 may be referred to as sensor 141 in the discussion hereafter, with the understanding that other electrical components, such as semiconductor dies, semiconductor packages (e.g., dies with packages) may also be used. Although FIG. 5 shows two sensors 141, one sensor or more than two sensors could also be attached to semiconductor structure 500. In some embodiments, sensors 141 may have the same dimension. In other embodiments, sensors 141 may have different dimensions (e.g., height $t_2$ and $t_3$ in FIG. 6).

Referring to FIG. 5, contact pads 143 of sensors 141 are aligned with corresponding UBMs 127a of the semiconductor structure 500, and a reflow process is performed to physically and electrically couple sensors 141 to semiconductor structure 500, in accordance with some embodiments. Sensors 141 may be attached to UBMs 127a using surface mount technology (SMT). For example, sensors 141 may be placed on semiconductor structure 500 and held in place temporarily by solder past 129. Heat source such as infrared lamp and hot air may be used to melt solder paste 129 and form connectors 139 between contact pads 143 of sensors 141 and UBMs 127a of semiconductor structure 500. In some embodiments, the reflow process is performed in a reflow soldering oven.

FIG. 5 shows semiconductor structure 500 having one MCPS 550 with sensors 141 attached for the purpose of illustration. However, tens, hundreds, or even more MCPS 550's with respective sensors 141 attached may be formed in semiconductor structure 500 simultaneously by the processing steps shown in FIGS. 1-5. A dicing process (not shown) is subsequently performed to separate, or dice, semiconductor structure 500 to form a plurality of individual MCPS 550's, in some embodiments. Dicing may be performed using a dicing blade, or laser, as examples. After dicing, DAF 103 may be removed by, e.g., peeling off from MCPS 550.

Figure 6:
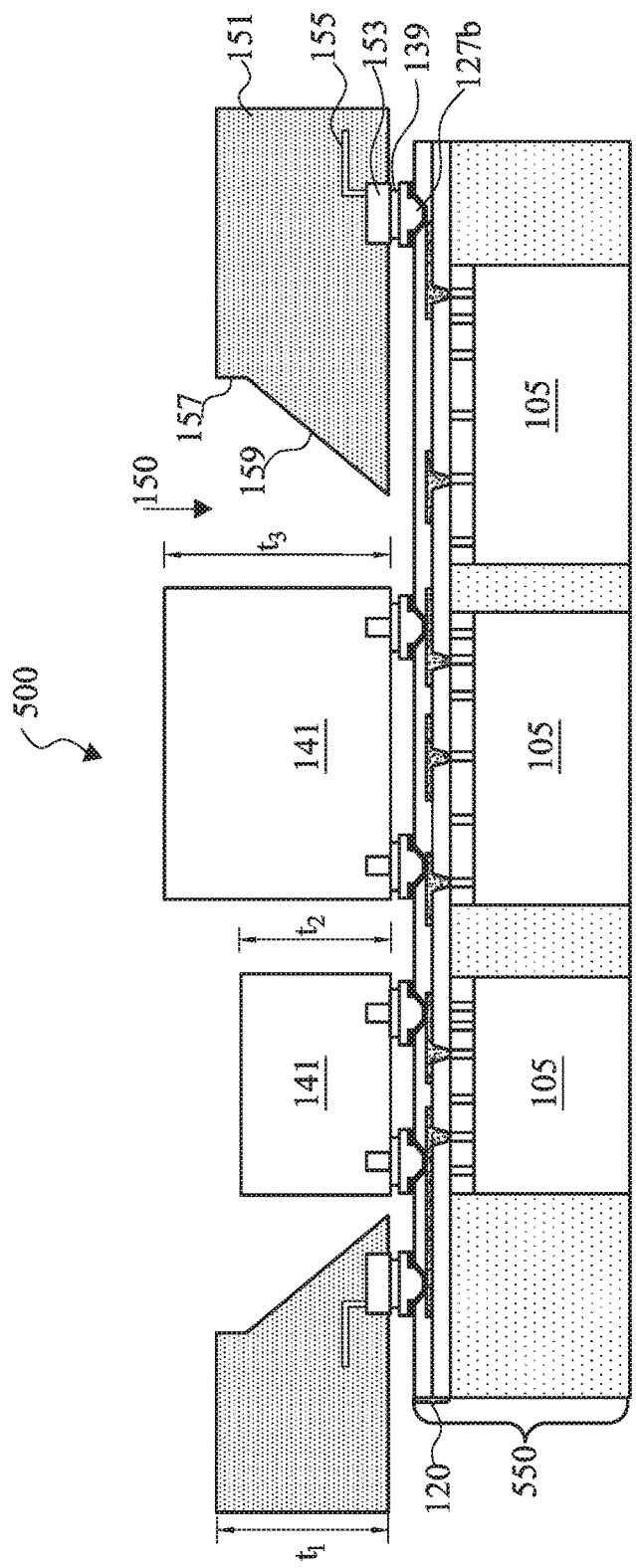

Referring to FIG. 6, UBMs 127b of MCPS 550 are aligned with respective conductive features 153 on a first side of a workpiece 151, and a bonding process (e.g., a reflow process) is performed to physically and electrically bond workpiece 151 with MCPS 550, in accordance with some embodiments. Connectors 139 are formed between conductive feature 153 of workpiece 151 and UBMs 127b of MCPS 550 after the bonding process, in some embodiments. Workpiece 151 may be, e.g., a printed circuit board (PCB), an interposer, or any other suitable substrate. Workpiece 151 may have conductive features 153 such as contact pads or lands on the first side, which conductive feature 153 may be electrically coupled to other conductive features 155 (e.g., conductive lines, conductive vias) formed in workpiece 151. In an exemplary embodiment, the workpiece 151 is a PCB with an opening or a cavity 150 extending from the first side of the PCB 151 to a second side of the PCB 151 opposing the first side. The size of the opening 150 is large enough to accommodate sensors 141, in some embodiments. In various embodiments, opening 150 of PCB 151 is located such that when MCPS 550 and PCB 151 are bonded together, sensors 141 are positioned in the opening. As illustrated in FIG. 6, a height of sensor 141 (e.g., height $t_2$) may be equal to or smaller than a height of PCB 151 (e.g., height $t_1$). Alternatively, a height of sensor 141 (e.g., height $t_3$) may be larger than a height of PCB 151 (e.g., height $t_1$), thus a top portion of sensor 141 may protrude above an upper surface of PCB 151. Opening 150 may be designed into PCB 151 during the design phase such that opening 150 is ready when PCB 151 is made. Alternatively, opening 150 may be formed after PCB 151 is made by removing a desired portion of PCB 151 corresponding to locations of sensors 141 using, e.g., a blade, laser, or a drilling tool. As illustrated in FIG. 6, opening 150 may have sloped sidewalls 159. The width of the opening 150 gradually increases from the first side of PCB 151 with conductive features 153 to the second side of PCB 151 opposing the first side, in some embodiments. In an embodiment, the sloped sidewalls 159 end below the second side of PCB 151 and intersect with straight sidewalls 157, where the straight sidewalls 157 are substantially perpendicular to the second side of PCB 151 and extends to the second side of PCB 151. By positioning sensors 141 in the cavity 150, a total height of the semiconductor structure 500 is advantageously reduced compared with a semiconductor structure having sensors 141 attached to the second side of workpiece 151.

Figure 7:
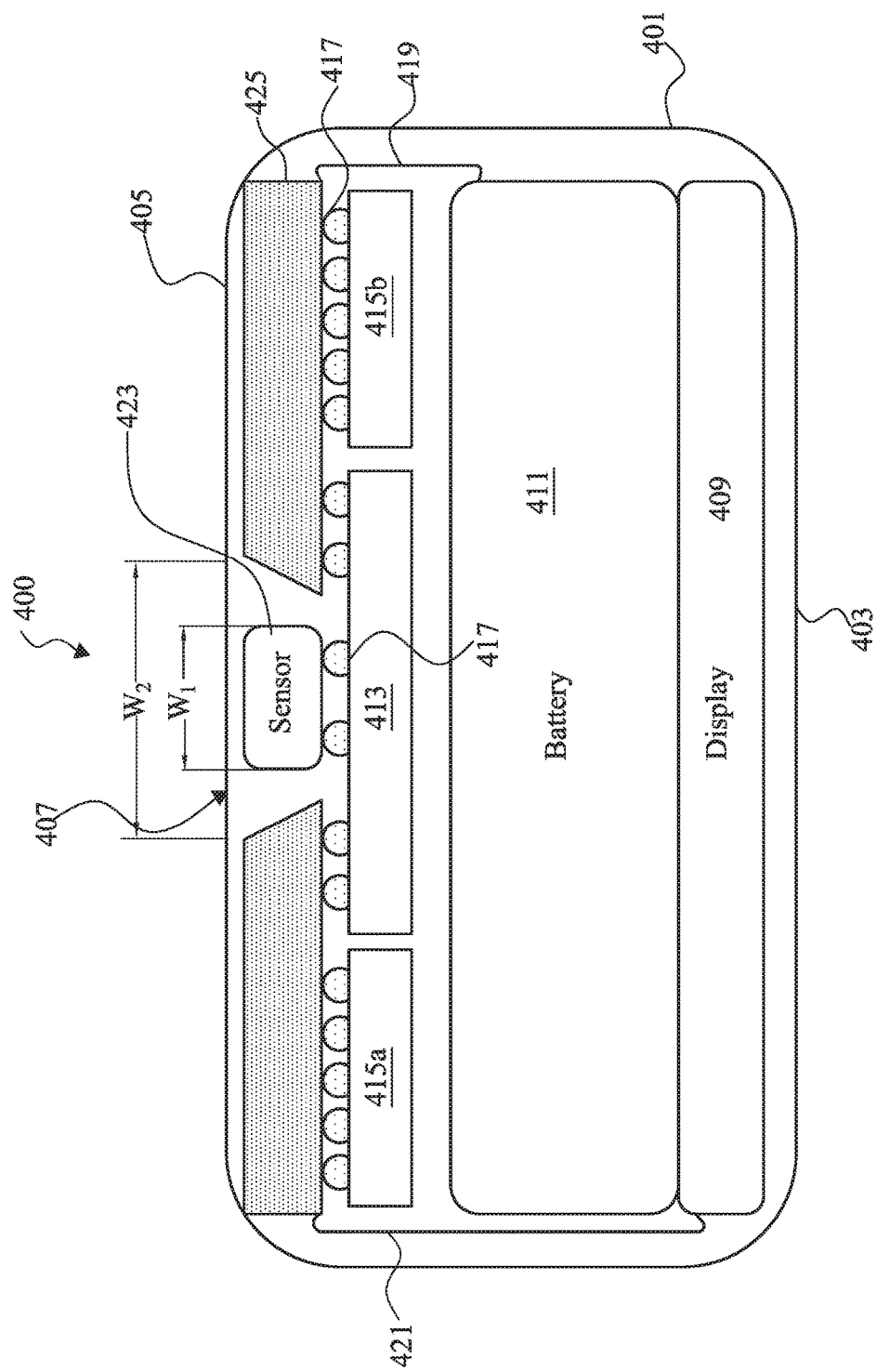
FIG. 7 illustrates a cross-sectional view of a semiconductor structure, in accordance with various embodiments.

FIG. 7 illustrates another embodiment semiconductor structure 400. The semiconductor structure 400 in FIG. 7 includes an MCPS 413 with a sensor 423 attached to MCPS 413 via connectors 417. The connectors 417 may be formed by, e.g., bonding UBMs (not shown) of MCPS 413 with contact pads (not shown) of sensor 423, similar to the formation of connectors 139 described above with reference to FIG. 5. The sensor 423 may be a temperature sensor, a humidity sensor, a heart rate sensor, a LED sensor, or an environment sensor, as example. Although one sensor 423 is shown in FIG. 7, two or more sensors 423 may be used. MCPS 413 may have a same or similar structure as MCPS 550 shown in FIGS. 5 and 6. A first side of a workpiece 425 (e.g., a PCB) is bonded to MCPS 413 by connectors 417, in some embodiments. Workpiece 425 has an opening or through-hole where sensor 423 is disposed. As illustrated in FIG. 7, the combination of MCPS 413, sensor 423 and workpiece 425 is substantially the same as or similar to the semiconductor structure 500 in FIG. 6.

In various embodiments, besides MCPS 413, other electrical components 415a and 415b are also attached to the first side of workpiece 425 by connectors 417. Electric components 415a and 415b may be similar to or different from each other. As an example, electrical component 415a may be a semiconductor die or a semiconductor package, and electric component 415b may be a discrete electrical component, e.g., passive or active device such as a capacitor, inductor, resistor, transistor, diode, or the like. One skilled in the art will appreciate that FIG. 7 is just an illustration, other numbers of MCPS 413, sensors 423 and electrical components 415a/415b could be used in the semiconductor structure 400 without departing from the spirit of the current disclosure.

As illustrated in FIG. 7, a battery 411 is electrically coupled to workpiece 425 by a cable 419, with the MCPS 413 disposed between battery 411 and workpiece 425. In some embodiments, cable 419 is a flexible cable, such as a flexible printed circuit (FPC) cable. A display device 409, such as an LCD display device, is disposed next to battery 411, with battery 411 being disposed between MCPS 413 and the display device 409. Display device 409 is electrically coupled to the workpiece 425 by a cable 421, such as an FPC cable, in some embodiments.

Referring to FIG. 7, semiconductor structure 400 has a housing 401, in accordance with some embodiments. The housing 401 has a front side 403 and a back side 405, with the front side 403 proximate the display device 409 and the back side 405 proximate sensor 423 and workpiece 425, in various embodiments. In some embodiments, semiconductor structure 400 comprises a wearable device, such as a smart watch, a fitness device, or a health monitoring device. The sensor 423 may sense or measure certain vital statistics of the user (e.g., a human wearing a wearable device), thus back side 405 of housing 401 may touch or be close to the skin of the user. The backside 405, or a portion 407 of back side 405 that is over sensor 423, is made of a first material that is conducive to the sensing and measurement needs of sensor 423, in some embodiments. For example, the first material may allow light of certain wavelength(s) to pass through (e.g., for LED sensor measurement), or may conduct heat (e.g., for temperature sensor measurement). The first material may possess physical, electrical or other types of characteristics to satisfy the sensing needs of multiple sensors of semiconductor structure 400. Back side 405 may include a portion 407 with a width $w_2$ larger than or equal to a width $w_1$ of sensor 423, as shown in FIG. 7, although $w_2$ may be smaller than $w_1$ as well (not shown). In an embodiment, portion 407 of back side 405 forms a measurement window and is made of a material different than other portions of back side 405.

As illustrated in FIG. 7, front side 403 of housing 401 is adjacent to display device 409. A second material of the front side 403 is transparent such that display of the display device 409 is visible to the user, in some embodiments. For example, glass, quartz or other suitable materials may be used as the second material for front side 403. The second material may be the same as the first material, in some embodiments. In other embodiments, the second material comprises a suitable material to support the touch screen operation of the display device 409. In yet another embodiment, front side 403 has an opening to expose the display device 409 such that a user can directly interact with the display device 409 (e.g., using fingers or an input device such as a stylus pen). Different portions of housing 401 (e.g., front side 403, back side 405) comprise different materials, in some embodiments. In other embodiments, different portions of housing 401 are made of a same material.

Figure 8:
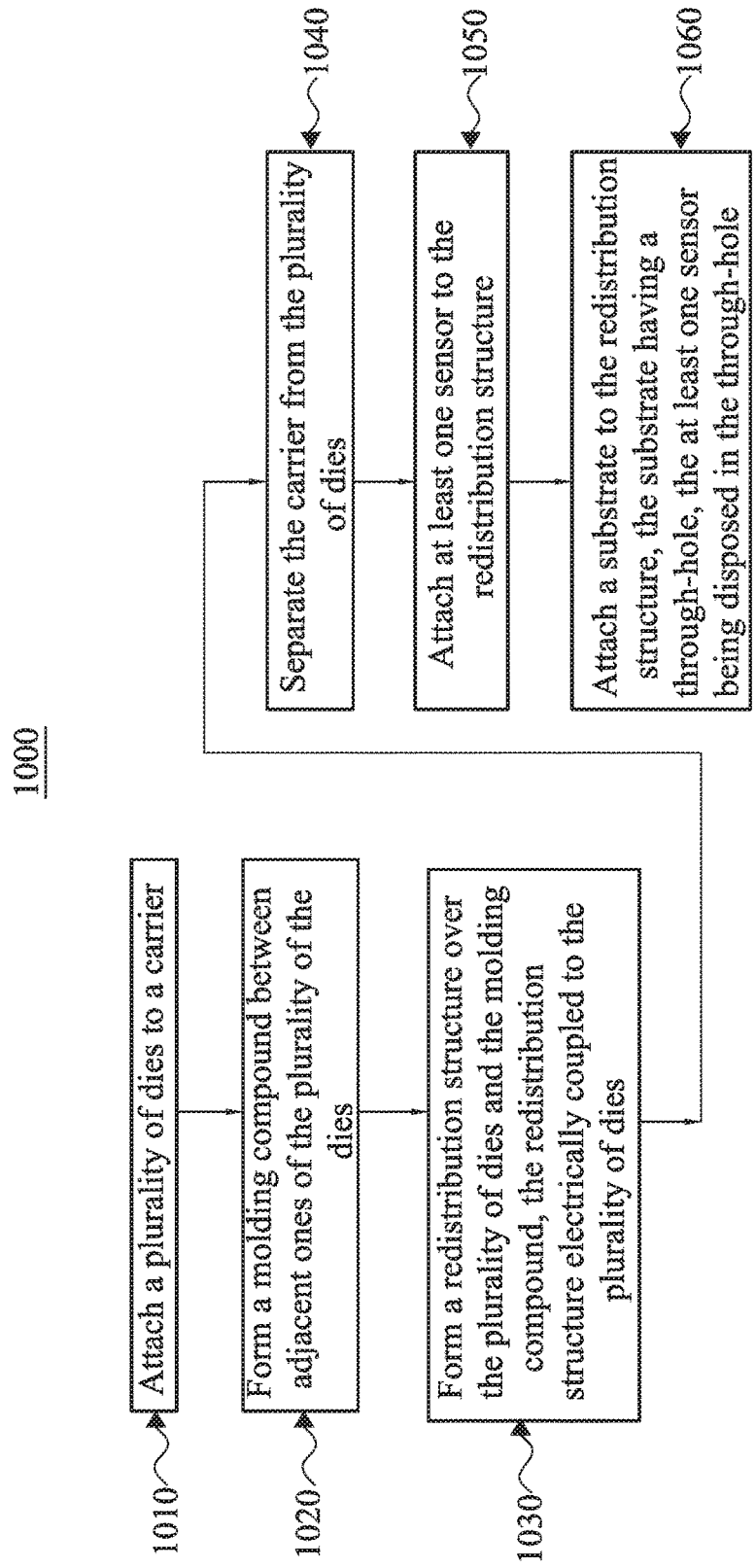
FIG. 8 illustrates a flow chart of a method for fabrication of a semiconductor structure, in accordance with some embodiments.

FIG. 8 illustrates a flow chart of a method of fabricating a semiconductor structure, in accordance with some embodiments. It should be understood that the embodiment methods shown in FIG. 8 is an example of many possible embodiment methods. One of ordinary skill in the art would recognize many variations, alternatives, and modifications. For example, various steps as illustrated in FIG. 8 may be added, removed, replaced, rearranged and repeated.

Referring to FIG. 8. At step 1010, a plurality of dies is attached to a carrier. At step 1020, a molding compound is formed between adjacent ones of the plurality of dies. At step 1030, a redistribution structure is formed over the plurality of dies and the molding compound. The redistribution structure is electrically coupled to the plurality of semiconductor dies. At step 1040, the carrier is separated from the plurality of dies. At step 1050, at least one sensor is attached to the redistribution structure. The at least one sensor may be attached to the redistribution structure via UBMs that are coupled to the redistribution structure. At step 1060, a substrate is attached to the redistribution structure. The substrate has a through-hole, and the at least one sensor is disposed in the through-hole. The substrate may be attached to the redistribution structure via UBMs that are coupled to the redistribution structure.

Advantages of embodiment systems and methods include higher level of integration, reduction of MCP package area and reduction of the height of the semiconductor structure. For example, by disposing sensors (e.g., sensors 141 or sensors 423) in the cavity of the workpiece (e.g., workpiece 151 and 425), the overall height of the semiconductor structure needed to accommodate sensors 141 or 423 is reduced. In the example of FIG. 7, a reduction of height needed to accommodate sensors 423 means more space is available within housing 401 for other purposes, such as more space for a larger battery 411, or more space for other electrical components and/or another workpiece to accommodate more functions. As another example, by integrating semiconductor dies instead of semiconductor packages in a MCP package, the MCP package size (e.g., area) is smaller than the area occupied by all the corresponding semiconductor packages, as illustrated by the description below with reference to FIG. 9.

Figure 9:
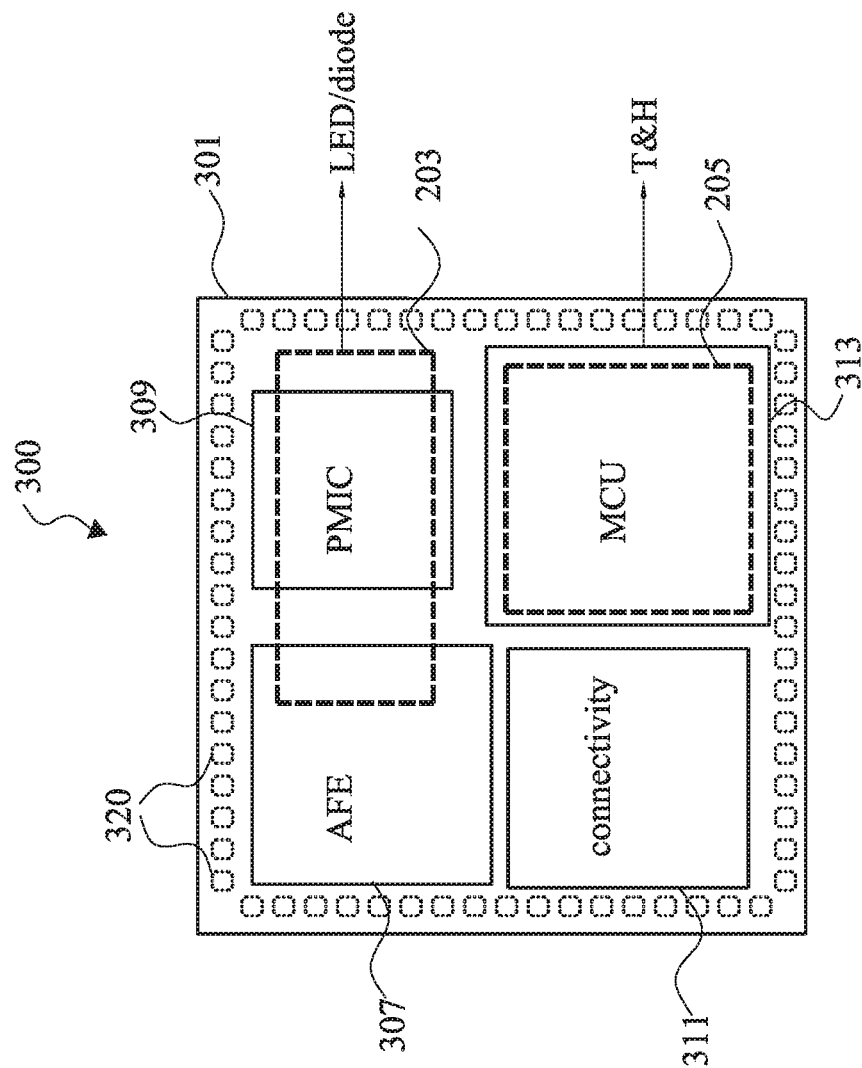
FIG. 9 illustrates a top view of a system having a MCP package, in accordance with some embodiments.

FIG. 9 illustrates a top view of an embodiment semiconductor structure 300. As illustrated in FIG. 9, a plurality of bare semiconductor dies (e.g., dies 307, 309, 311 and 313 without package) are integrated together in an MCPS, and sensors (e.g., sensors 203 and 205, shown in phantom) are attached to the MCPS following similar steps as shown in FIGS. 1-5. In the example of FIG. 9, the side of semiconductor structure 300 having the sensors faces the inside of the paper, thus sensors 203/205 and UBMs 320 are shown in phantom, with UBMs 320 formed around perimeters of the semiconductor structure 300. Some UBMs 320 may be formed in the middle portions of semiconductor structure 300 but are not shown in FIG. 9 for simplicity. The plurality of semiconductor dies may include an analog front end (AFE) die 307, a connectivity die 311 (e.g., a WiFi/BluTooth module), a power management integrated circuit (PMIC) 309, and a micro-controller unit (MCU) 313, as examples. Two sensors 203 and 205 are attached to UBMs 320 (not shown) of the semiconductor structure 300 through an opening of PCB 301 (e.g., not shown, similar to the opening of FIG. 6) thus shown in phantom in FIG. 9. Sensor 203 might be an LED/diode sensor, and sensor 205 may be a temperature/humidity sensor, as examples. In the examples shown above in FIG. 9, because bare dies instead of semiconductor packages are integrated together in the MCPS, the total area of the semiconductor structure 300 (e.g., area of PCB 301) is much smaller than a solution that integrates the corresponding semiconductor packages. For example, a 65% reduction of PCB area has been observed using the embodiment system shown in FIG. 9. In addition, by placing the sensors in the opening of the PCB 301, the total thickness of the semiconductor structure 300 is advantageously reduced.

In accordance with an embodiment, a semiconductor structure includes a multi-chip package system (MCPS). The MCPS includes one or more dies, a molding compound extending along sidewalls of the one or more dies, and a redistribution layer (RDL) over the one or more dies and the molding compound, with the RDL electrically coupled to the one or more dies. The semiconductor structure further includes at least one sensor coupled to the RDL of the MCPS, with the RDL interposed between the at least one sensor and the one or more dies, and a substrate having a first plurality of conductive features on a first side of the substrate. The first plurality of conductive features is coupled to the RDL of the MCPS. The substrate includes a cavity extending from the first side of the substrate to a second side of the substrate opposite the first side, and the at least one sensor is disposed in the cavity.

In other embodiments, a semiconductor structure includes a display device, a battery, a substrate having a first side facing the battery and the display device, and a second side opposing the first side. The substrate has an opening extending from the first side to the second side. The battery is disposed between the substrate and the display device. The semiconductor structure also includes a first semiconductor package disposed between the substrate and the battery. The first semiconductor package extends across the opening of the substrate, and a first side of the first semiconductor package is coupled to the first side of the substrate. The semiconductor structure further includes a sensor coupled to the first side of the first semiconductor package. The sensor is disposed in the opening of the substrate.

In yet other embodiments, a method of forming a semiconductor structure includes attaching a plurality of dies to a carrier, forming a molding compound between adjacent ones of the plurality of the dies, and forming a redistribution structure over the plurality of dies and the molding compound, the redistribution structure electrically coupled to the plurality of dies. The method further includes separating the carrier from the plurality of dies, attaching at least one sensor to the redistribution structure, and attaching a substrate to the redistribution structure, the substrate having a through-hole, the at least one sensor being disposed in the through-hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a first multi-chip package system (MCPS) comprising:
   one or more dies;
   a molding compound extending along sidewalls of the one or more dies; and
   a redistribution layer (RDL) over the one or more dies and the molding compound, wherein the RDL is electrically coupled to the one or more dies;
   at least one sensor coupled to the RDL of the first MCPS, wherein the RDL is interposed between the at least one sensor and the one or more dies; and
   a substrate having a first plurality of conductive features on a first side of the substrate, wherein the first plurality of conductive features is coupled to the RDL of the first MCPS, wherein the substrate comprises a cavity extending from the first side of the substrate to a second side of the substrate opposite the first side, wherein the at least one sensor is disposed in the cavity.

2. The semiconductor structure of claim 1, wherein the RDL extends laterally beyond boundaries of the one or more dies.

3. The semiconductor structure of claim 1, wherein the at least one sensor comprises a heart rate sensor, a temperature sensor, a humidity sensor, an LED sensor, or an environment sensor.

4. The semiconductor structure of claim 1, wherein the first MCPS further comprises a plurality of under-bump-metallurgy structures (UBMs) on the RDL, wherein the at least one sensor is coupled to the RDL via respective UBMs.

5. The semiconductor structure of claim 1, wherein the at least one sensor comprises a first sensor, wherein a first thickness of the substrate is greater than or equal to a second thickness of the first sensor.

6. The semiconductor structure of claim 1, wherein the at least one sensor comprises a first sensor, wherein a first thickness of the substrate is smaller than a second thickness of the first sensor.

7. The semiconductor structure of claim 1, wherein the substrate is a printed circuit board (PCB).

8. The semiconductor structure of claim 1, further comprising a display device coupled to the substrate, wherein the first MCPS is disposed between the display device and the substrate.

9. The semiconductor structure of claim 8, further comprising a battery disposed between the display device and the first MCPS.

10. The semiconductor structure of claim 9, further comprising:
a first flexible cable electrically coupling the display device to the substrate; and
a second flexible cable electrically coupling the battery to the substrate.

11. The semiconductor structure of claim 9, wherein the semiconductor structure further comprises a second MCPS between the substrate and the battery, the second MCPS electrically coupled to the first side of the substrate.

12. The semiconductor structure of claim 11, further comprising a housing, wherein the display device, the battery, the substrate, the first MCPS, the second MCPS and the sensor are enclosed in the housing.

13. The semiconductor structure of claim 12, wherein the display device is proximate to a first side of the housing, and the sensor is proximate to a second side of the housing opposing the first side of the housing, wherein there is a measurement window on the second side of the housing, the measurement window being directly over the sensor.

14. The semiconductor structure of claim 13, wherein the first side of the housing and the second side of the housing comprise different materials.

15. The semiconductor structure of claim 13, wherein the first side of the housing has a display window over the display device.

16. A semiconductor structure comprising:
a substrate having a first side and a second side opposing the first side, the substrate having a first conductive feature on the first side, the substrate having an opening extending from the first side to the second side;
a sensor in the opening of the substrate; and
a first multi-chip package system (MCPS) on the first side of the substrate, the first MCPS comprising:
a redistribution layer (RDL) over a molding layer; and
one or more dies embedded in the molding layer and electrically coupled to the RDL;
wherein the RDL of the first MCPS is electrically coupled to the sensor and the first conductive feature of the substrate.

17. The semiconductor structure of claim 16, further comprising a second sensor in the opening of the substrate, wherein the second sensor is electrically coupled to the RDL of the first MCPS.

18. The semiconductor structure of claim 17, further comprising a second MCPS on the first side of the substrate and electrically coupled to a second conductive feature on the first side of the substrate.

19. A structure comprising:
A workpiece having an opening extending from a first side of the workpiece to a second side of the workpiece opposing the first side, the workpiece having a first conductive feature on the first side;
a first multi-chip package system (MCPS) on the first side of the workpiece, the first MCPS comprising:
a redistribution layer (RDL) over a molding layer; and
one or more dies embedded in the molding layer and electrically coupled to the RDL, wherein the RDL is electrically coupled to the first conductive feature of the workpiece; and
a first sensor electrically coupled to the RDL of the first MCPS, wherein the first sensor is disposed in the opening of the workpiece, wherein the first sensor is a heart rate sensor, a temperature sensor, a humidity sensor, a LED sensor, an environment sensor, or combinations thereof.

20. The structure of claim 19, further comprising a second sensor electrically coupled to the RDL of the first MCPS, the second sensor being disposed in the opening of the workpiece, wherein a height of the second sensor measured along a first direction from the first side of the workpiece to the second side of the workpiece is different from a height of the first sensor measured along the first direction.

* * * * *